US010802050B2

(12) United States Patent
Barthel et al.

(10) Patent No.: US 10,802,050 B2
(45) Date of Patent: Oct. 13, 2020

(54) METHOD FOR ANALYZING A MEASURED SIGNAL AS WELL AS MEASUREMENT UNIT

(71) Applicant: Rohde & Schwarz GmbH & Co. KG, Munich (DE)

(72) Inventors: Sven Barthel, Chemnitz (DE); Thomas Guenther, Waldenburg (DE); Michael Boehme, Starkenberg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 279 days.

(21) Appl. No.: 15/794,361

(22) Filed: Oct. 26, 2017

(65) Prior Publication Data
US 2019/0128925 A1    May 2, 2019

(51) Int. Cl.
*G01R 13/02* (2006.01)

(52) U.S. Cl.
CPC ....... *G01R 13/0272* (2013.01); *G01R 13/029* (2013.01); *G01R 13/0245* (2013.01); *G01R 13/0254* (2013.01)

(58) Field of Classification Search
CPC .................................................. G01R 13/0272
USPC ............................................................ 702/70
See application file for complete search history.

(56) References Cited

U.S. PATENT DOCUMENTS

| | | | | |
|---|---|---|---|---|
| 2005/0261853 | A1* | 11/2005 | Dobyns | G01R 13/0272 702/108 |
| 2014/0073968 | A1* | 3/2014 | Engelbrecht | A61B 5/72 600/479 |
| 2015/0370234 | A1* | 12/2015 | Lehane | G01R 13/0272 326/46 |

* cited by examiner

*Primary Examiner* — Ricky Ngon
(74) *Attorney, Agent, or Firm* — Christensen O'Connor Johnson Kindness PLLC

(57) ABSTRACT

Methods for analyzing a measured signal, and a measurement unit for carrying out these methods, are provided. The method includes, acquiring at least a first segment and a second segment of the measured signal by a measurement unit; storing the at least a first segment and a second segment in an acquisition memory of the measurement unit; applying a filter on the at least a first segment and a second segment; and storing at least one segment of the at least a first segment and a second segment that corresponds to the filter into at least one of a display memory and a processor memory of the measurement unit.

17 Claims, 5 Drawing Sheets

METHOD FOR ANALYZING A MEASURED SIGNAL AS WELL AS MEASUREMENT UNIT

FIELD OF THE DISCLOSURE

Embodiments of the present disclosure relate generally to a method for analyzing a measured signal as well as a measurement unit for analyzing a measured signal.

BACKGROUND

Measurement units, e.g., oscilloscopes, usually comprise an acquisition memory to store the signal measured by the measurement unit. It is known that in certain operation modes segments of the measured signal are stored in the acquisition memory for subsequent data analysis.

The data analysis can be done visually by the user of the measurement unit. In this case, the segments stored in the acquisition memory are loaded into a display memory and displayed on a display unit of the measurement unit. The user may then scroll through the segments for analysis.

Depending on the task, not all of the segments of the measured signal are relevant and do not need to be analyzed. Thus, displaying and analyzing these segments occupies resources unnecessarily.

SUMMARY

Thus, there is a need for processing only the segments that are relevant to the task at hand. To address this need or others, the present disclosure provides a method for analyzing a measured signal comprising the following steps:

a) acquiring at least a first segment and a second segment of the measured signal by a measurement unit;

b) storing the at least a first segment and a second segment in an acquisition memory of the measurement unit;

c) applying a filter on the at least a first segment and a second segment; and d) storing at least one segment of the at least a first segment and a second segment that corresponds to the filter into at least one of a display memory and a processor memory of the measurement unit.

Further, the disclosure provides a measurement unit for analyzing a measured signal, wherein the measurement unit is configured to perform the following steps:

a) acquiring at least a first segment and a second segment of the measured signal by a measurement unit;

b) storing the at least a first segment and a second segment in an acquisition memory of the measurement unit;

c) applying a filter on the at least a first segment and a second segment; and d) storing at least one segment of the at least a first segment and a second segment that corresponds to the filter into at least one of a display memory and a processor memory of the measurement unit.

By applying a filter on the segments stored in the acquisition memory, only selected segments of the measured signal are transferred for further processing and/or analysis, e.g., transferred to a processor memory and/or a display memory. The filter is chosen to be feasible for the task, thus, only relevant segments are processed further reducing the resources needed for processing and analyzing. A manual search by the user in order to identify the relevant segments is no more necessary as it can be done automatically such that resources and time are saved. Only the relevant segments are provided that correspond to the respective filter applied to all segments acquired.

Within this disclosure "segments of a signal" refer to a digital representation of parts of the signal measured by the measurement unit.

For example, the filter is supplied by comparing the at least a first segment and a second segment with a filter condition of the filter, and one of the segments of the at least a first segment and a second segment corresponds to the filter if the segment meets the filter condition. Hence, precise selection of the segments is possible.

In some embodiments, the filter is applied by comparing the at least a first segment and a second segment with a filter condition of the filter, and one of the segments of the at least a first segment and a second segment corresponds to the filter if the segment does not meet the filter condition. This generally allows for more complex filters.

The filter may relate to fulfill the filter condition or to not fulfill the filter condition. Hence, each filter condition may correspond to at least two different filters.

Generally, a filter may relate to a certain parameter, for instance a threshold value, wherein the filter condition relates to a certain condition of this parameter, for instance higher or lower than the threshold value.

In an embodiment of the disclosure, each of the at least a first segment and a second segment corresponding to the filter is stored in the at least one of a display memory and a processor memory leading to a complete data set for further processing. As only the segment(s) is/are stored that correspond to the filter, the further processing can be limited to the relevant segment(s) such that the further processing is simplified.

For visual analysis by a user, the one or more segments stored in the at least one of a display memory and a processor memory are displayed by a display unit of the measurement unit.

For example, the measurement unit is provided with at least two different filter conditions allowing a combination of different filter conditions. One filter may have more than one filter condition.

In some embodiments, the measurement unit is provided with at least two different filters so that relevant segments for different tasks can be selected.

The filter, in particular the appropriate filter condition, may be chosen by the user of the measurement unit. The user may select the relevant filter from a list, for instance. Thus, the measurement unit offers a list of different filters such that the user may choose the filter(s) being of interest.

Generally, the filter(s) may be set up dynamically, for instance in an automated manner depending on an operation mode of the measurement unit. Accordingly, a certain sequence of different filters may be applied subsequently.

In an aspect of the disclosure, at least one of a bus error filter, a search event filter, a clipping filter, and a time controlled filter is provided. This way, relevant segments for various tasks can be provided. Moreover, a filter may be actively chosen that corresponds to showing all segments acquired in an unfiltered manner.

For example, the filter condition of the bus error filter is the presence of at least one bus error in order to analyze the function of a bus. The filter may be independent from the bus type and the respective error type.

In a variation, the filter condition of the search event filter is a threshold value of a characteristic property. The characteristic property may be the pulse width, the maximum amplitude, the minimum amplitude of the waveform of the segment or the like. This enables versatile waveform analysis.

In another aspect of the disclosure, the filter condition of the clipping filter is the presence of at least one override of an analog-to-digital converter of the measurement unit in order to detect deviations in the measured signal.

For analyzing the measured signal in specific time intervals, the filter condition of the time control filter is a time interval of segment acquisition times. The time interval of the segment acquisition times may be a time interval in which the segment in question has to have been acquired to meet the filter condition.

In another embodiment, the at least a first segment and a second segment are acquired simultaneously or at different times to allow multi-signal analysis. The at least a first and a second segments stored in the acquisition memory may represent a history of the measured signal.

For a more detailed analysis of the signal the one or more segments stored in the at least one of a display memory and a processor memory are played using a segment player provided by the measurement unit.

In order to provide a quick and intuitive form of data analysis for the user, the measurement unit is configured to allow the user of the measurement unit to scroll through the one or more segments stored in the at least one of a display memory and a processor memory.

As already mentioned, only those segments are provided for displaying purposes that match the filter (condition) such that only the segments being of interest are further processed. Accordingly, the matching segments are directly available for the user of the measurement unit.

Since the matching segments do not have to be subsequent segments, a non-continuous list of segments may be provided for further processing, e.g., stored in the respective memory, when the at least one filter is applied. The non-continuous list of segments relate to the order of the acquisition of the different segments.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
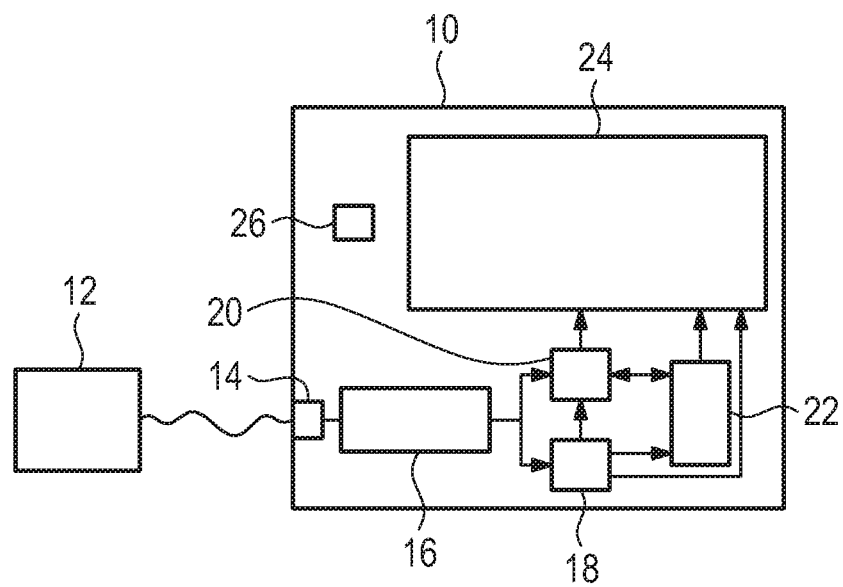
FIG. 1 shows a measurement unit according to one embodiment of the disclosure.

FIG. 1 shows a measurement unit 10, for example an oscilloscope, connected to a device under test 12 to measure a signal provided by the device under test 12. As shown, the measurement unit 10 comprises an analog-to-digital converter 14, an acquisition memory 16 connected to the analog-to-digital converter 14, a processor memory 18, a display memory 20, a segment player 22 and a display unit 24. Further, the measurement unit 10 includes a control unit 26 controlling the measurement unit 10 and its components mentioned above.

The processor memory 18 is connected to the acquisition memory 16 for receiving segments 28 (FIG. 4) of the signal received. The segments 28 are acquired by the acquisition memory 16 in a known manner. The processor memory 18 is further connected to the display memory 20, the segment player 22 and the display unit 24 for transferring at least some of the segments 28 acquired.

The display memory 20 is connected to the acquisition memory 16 and the processor memory 18 for receiving data. The display memory 20 is also connected to the display unit 24 for transferring data. Further, the display memory 20 is connected to the segment player 22 for receiving and transferring data. The segment player 22 may also be connected to the display unit 24 and the display memory 20 for transferring data.

The device under test 12 is connected to the analog-to-digital converter 14 of the measurement unit 10. This can be done, for example, using a probe, like a differential probe, etc. Of course, the analog-to-digital converter 14 may include several inputs and several analog-to-digital converters that are not mentioned or shown for the sake of simplicity.

Figure 2:
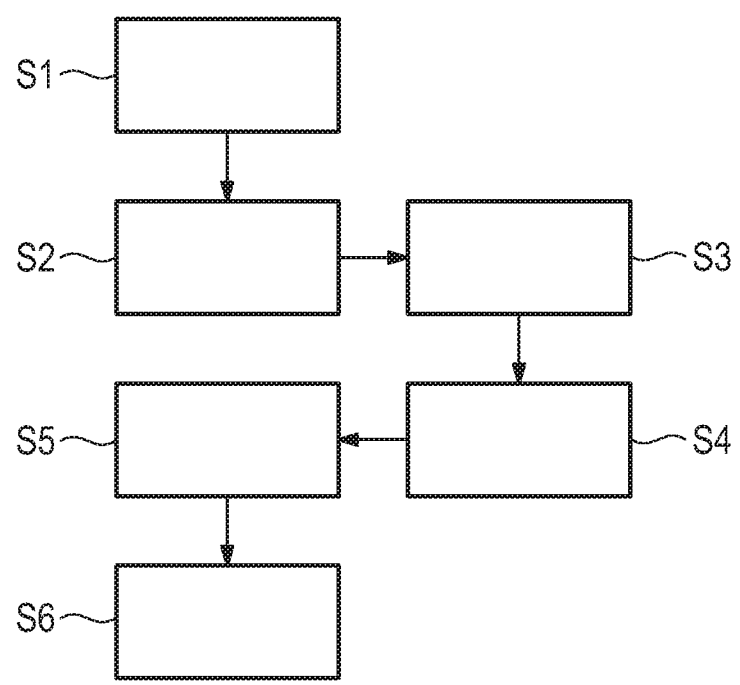
FIG. 2 shows a flow chart of a method according to an embodiment of the disclosure.

FIG. 2 shows a flow chart of a method for analyzing the measured signal. Firstly, the analog-to-digital converter 14 measures a signal from the device under test 12 or receives a measured signal from the probe and creates a digital representation of it. Parts of or the complete digital representation are stored in the acquisition memory 16 depending on the selected acquisition mode of the measurement unit 10. Acquisition can be performed in regular intervals or using a trigger. In embodiments having several measured signals, the signals may also be acquired simultaneously.

During acquisition, the segments 28 may be provided with a time stamp corresponding to the acquisition time or they may be otherwise linked to the acquisition time of the specific segment 28.

From the digital representation of the measured signal, segments 28 are acquired, for example, by an acquisition unit comprising the acquisition memory 16. The segments 28 are time limited sections of the measured signal (Step S1).

In general, the control unit 26 may comprise the acquisition unit in parts. In other words, the control unit 26 and the acquisition unit may share at least some components.

Figure 3:
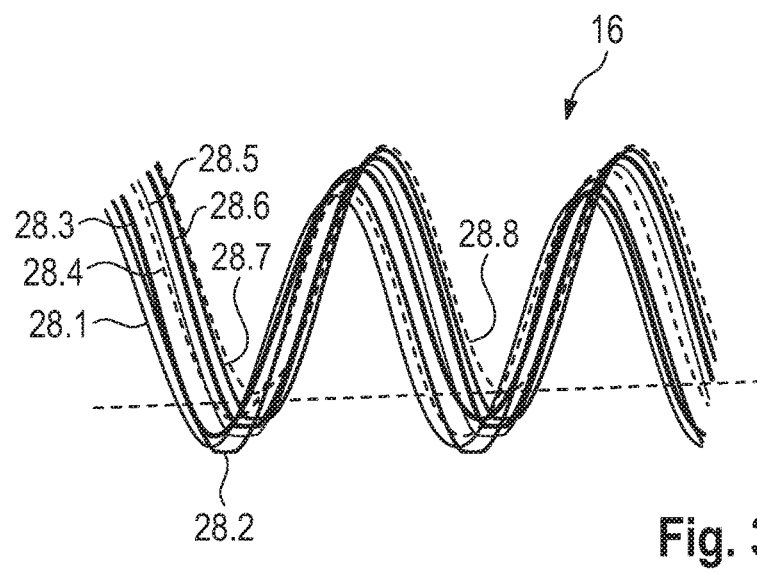
FIG. 3 shows one example of multiple segments of the measured signal stored in the acquisition memory.

The acquired segments 28 are then stored in the acquisition memory 16 (Step S2). The segments 28.1 to 28.8 may be acquired subsequently (FIG. 3). In this case the segments 28 stored in the acquisition memory 16 represent a history of the measured signal. As an example, the measured signal may be a waveform and the acquisition is triggered. Thus, the segments 28 are also waveforms and are very similar to each other.

FIG. 3 shows an illustration of such segments 28 stored in the acquisition memory 16. More precisely, a first segment 28.1, a second segment 28.2, a third segment 28.3, a fourth segment 28.4, a fifth segment 28.5, a sixth segment 28.6, a seventh segment 28.7, and an eighth segment 28.8 are stored in the acquisition memory 16. As described above, the different segments 28 do not occur simultaneously, but subsequently. They are only shown in this way for illustrative purposes.

The segments 28.1 to 28.8, more precisely the waveforms, have characteristic properties like a pulse width, a maximum amplitude, a minimum amplitude or the like.

Further, the second segment 28.2, the fifth segment 28.5, the sixth segment 28.6, and the seventh segment 28.7 are clipped, meaning that the measured signal did not lie temporarily within the measurement range of the analog-to-digital converter 14 which led to an override of the analog-to-digital converter 14.

Figure 4:
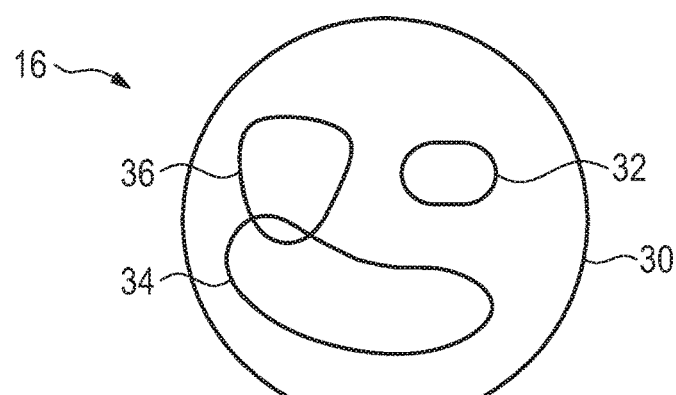
FIG. 4 illustrates the contents of the acquisition memory in an abstract way.

More generally and abstract, as illustrated in FIG. 4, the segments 28 in the acquisition memory 16 may have different properties. In FIG. 4, the outer circle illustrates the set 30 of all segments 28.1 to 28.8. Within this set 30, several subsets 32, 34, 36 of segments 28 may be formed. For example, a first subset 32 contains all clipped segments 28.2, 28.5, 28.6, and 28.7, a second subset 34 contains all unclipped segments 28.1, 28.3, 28.4, 28.8, and a third subset 36 contains segments with a minimum amplitude below a certain threshold value (illustrated as a dashed line in FIG. 3). For example, only segment 28.8 of the segments 28.1 to 28.8 is part of the third subset 36.

Returning to the example of FIG. 3 and assuming that the only segments 28 for the desired task are clipped segments 28.2, 28.5, 28.6, 28.7, it would be unnecessary and a waste of resources to process or display all segments 28.1 to 28.8 in the acquisition memory 16. In order to avoid wasting resources, a clipping filter is applied to the segments 28 stored in the acquisition memory 16, namely the first segment 28.1, the second segment 28.2, the third segment 28.3, the fourth segment 28.4, the fifth segment 28.5, the sixth segment 28.6, the seventh segment 28.7, and the eighth segment 28.8.

The clipping filter may be selected by the user, for instance, out of a list of different filters, or may be automatically applied by the measurement unit 10, for instance, when the measurement unit 10 is operated in a certain operation mode.

The clipping filter is used to separate the unclipped segments 28.1, 28.3, 28.4, 28.8 from the clipped segments 28.2, 28.5, 28.6, 28.7. The clipping filter has a filter condition being the presence of at least one override of the analog-to-digital converter 14, e.g., the presence of clipped sections. The filter is applied by comparing each of the segments 28.1 to 28.8 with the filter condition (Step S3).

Then, it is determined in step S4, if the segment 28 in question meets the filter condition, e.g., whether or not the segment 28 in question shows at least one override of the analog-to-digital converter 14. If so, the segment 28 in question corresponds to the filter.

Figure 5:
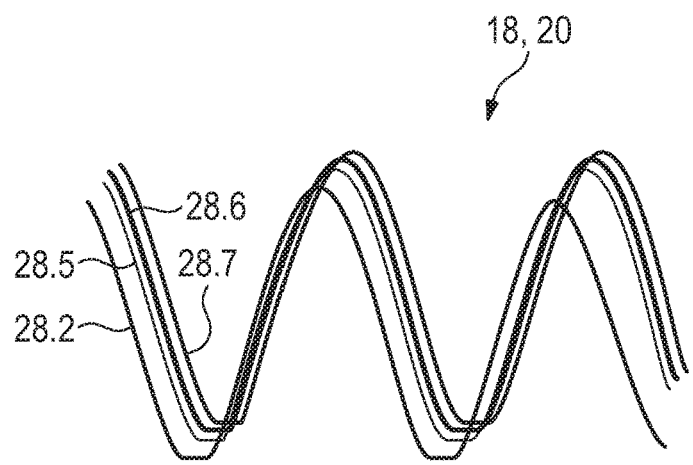
FIG. 5 shows the segments of FIG. 3 that correspond to a filter.

Applying the filter to each of the segments 28 stored the acquisition memory returns that the segments 28.2, 28.5, 28.6 and 28.7 correspond to the filter. In other words, the segments 28.2, 28.5, 28.6 and 28.7 are determined to have clipped sections. Each of the clipped segments 28.2, 28.5, 28.6, 28.7 is stored in the display memory 20 and/or the processor memory 18 (Step S5). FIG. 5 illustrates the content of the display memory 20 and/or the processor memory 18 after the filter has been applied.

It is of course possible that the filter condition is the presence of no overrides of the analog-to-digital converter 14, e.g., an unclipped segment 28. In this case, an unclipped segment 28 would be regarded as corresponding to the filter if that segment 28 does not meet the filter condition.

The clipped segments 28.2, 28.5, 28.6, 28.7 stored in the processor memory 18 may be processed further, e.g., to extract characteristic values or statistic parameters. Also, highlighting of specific sections of the clipped segments 28.2, 28.5, 28.6, 28.7 in the processor memory 18 may be done, e.g., the clipped sections may be highlighted.

After processing, the clipped segments 28.2, 28.5, 28.6, 28.7 may then be transferred and stored in the display memory 20. The segments 28.2, 28.5, 28.6, 28.7, if stored in the display memory 20, can be subsequently displayed by the display unit 24 (Step S6).

The user of the measurement unit 10 may then scroll through the displayed segments 28.2, 28.5, 28.6, 28.7 for visual data analysis. The measurement unit 10 may be provided with suitable input means (not shown), like a knob, to allow scrolling. All these segments 28.2, 28.5, 28.6, 28.7 fulfill the appropriate filter (condition) such that the user can easily check the segments being of interest as they correspond to the filter applied.

In addition or alternatively, the segments 28 stored in the processor memory 18 and/or the display memory 20 may be transferred to the segment player 22 that displays, either directly or via the display memory 20, the development over time of the specific segment 28.

It is of course possible that the measurement unit 10 is provided with more than one filter. For example, the measurement unit 10 may also have a search event filter, wherein the filter condition of the search event filter is a threshold value of a characteristic property. In this case the filter condition is met, if the characteristic property of the segment in question lies below or above the threshold value. The threshold value may be an upper limit for the minimum amplitude meaning that only segments 28 with a minimum amplitude below the upper limit correspond to the filter. In the situation shown in FIG. 4, the upper limit of the minimum amplitude is depicted as a dashed line and only segment 28.8 fulfils this filter condition.

It is of course possible for the search event filter and for any other filter to have more than one filter condition. For example, the search event filter may have threshold values for more than one characteristic property, e.g. an upper limit for a pulse width and an upper limit for a maximum amplitude.

Another filter may be a time controlled filter. The time controlled filter comprises a filter condition being a time interval in which the segment in question has to have been acquired. For example, if the time interval is set to be the past hour, only those segments 28 meet the filter condition that have been acquired during the past hour.

The filter may also be a bus error filter especially in situations in which the measured signal is a bus signal. The filter condition of the bus error filter may be the presence of at least one error in the bus signal in the segment in question.

Figure 6:
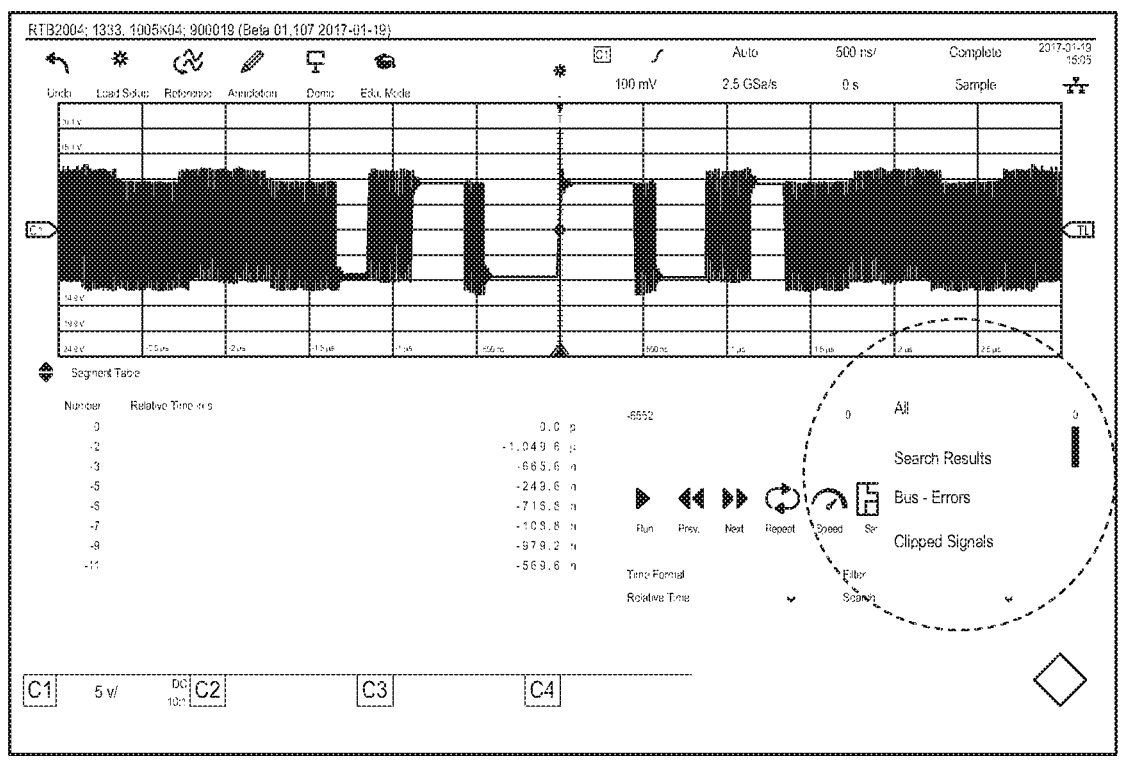
FIG. 6 shows an exemplary output of the display unit while the user selects a filter.

The filter and/or the filter conditions to be applied may be chosen by the user of the measurement unit 10 using, for example, a user interface as shown in FIG. 6 in the dashed circle.

Generally, the segments may correspond to the filter applied if said segment meets said appropriate filter condition or, as an alternative, if said segment does not meet said appropriate filter condition. Accordingly, the user has several options to investigate the different segments acquired in a detailed manner in order to obtain the segments being of interest.

Figure 7:
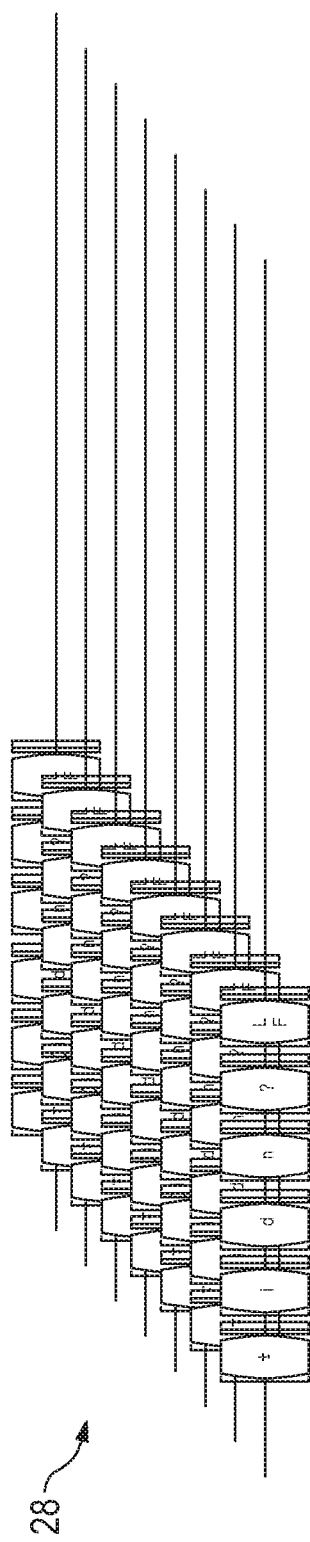
FIG. 7 shows another example of multiple segments of the measured signal stored in the acquisition memory.

In FIG. 7, it is shown that several segments 28 are acquired by the measurement unit 10 as described above wherein a bus error filter is applied on the several segments 28. In a similar manner as mentioned above, the different segments 28 are shown simultaneously for illustrative purposes. Usually, they occur subsequently.

Figure 8:
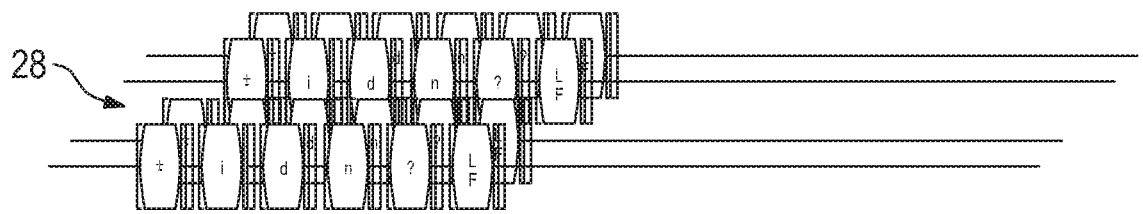
FIG. 8 shows the segments of FIG. 7 that correspond to a filter according to a first embodiment.

In FIG. 8, only those segments 28 are shown that correspond to the filter applied according to a certain embodiment. In the shown embodiment, the filter condition relates to segments having a bus error. Thus, only those segments 28 of all acquired ones are shown that comprise a bus error. Therefore, only those segments 28 are stored in at least one of said processor memory 18 and said display memory 20 that meet said applied filter condition "segment comprises a bus error".

Alternatively, the segments 28 shown in FIG. 8 also correspond to another filter applied as these segments 28 do not meet the filter condition "segment comprises no bus error". Thus, two different filters applied result in the same segments.

Figure 9:
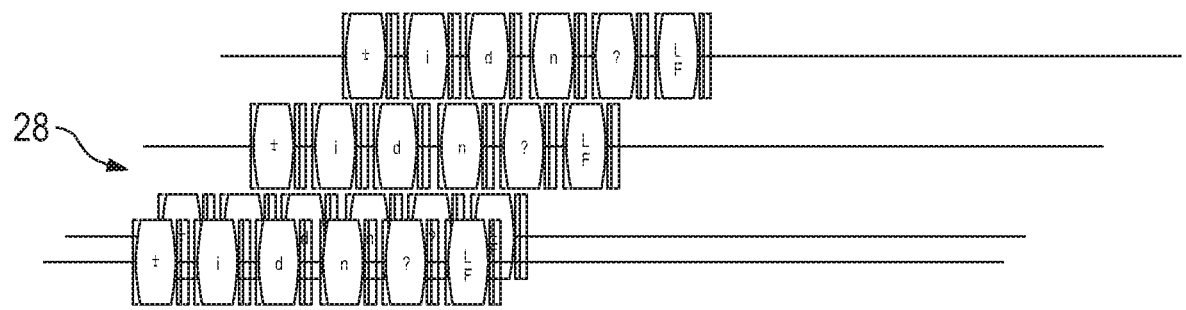
FIG. 9 shows the segments of FIG. 7 that correspond to a filter according to a second embodiment.

In the embodiment shown in FIG. 9, only those segments 28 are shown that do not meet the above mentioned filter condition "segment comprises a bus error". The segments 28 shown in FIG. 9 are the ones that were not disregarded by the filter applied according to the embodiment shown in FIG. 8. However, the segments 28 shown in FIG. 9 correspond to the filter applied according to the second embodiment since another filter was chosen compared to the one of FIG. 8. The segments 28 shown in FIG. 9 correspond to the respective filter as they do not meet the filter condition "segment comprises a bus error".

Alternatively, the segments 28 shown in FIG. 9 also correspond to another filter applied as these segments 28 meet the filter condition "segment comprises no bus error".

This demonstrates the diversity for obtaining the respective information intended by applying different filter(s).

The control unit 26 may include, in some embodiments, logic for implementing the technologies and methodologies described herein. This logic of the control unit 26 can be carried out in either hardware or software, or a combination of hardware and software. In some embodiments, the control unit 26 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 26 includes a microprocessor and a memory storing logic modules and/or instructions. In an embodiment, the control unit 26 includes one or more ASICs having a plurality of predefined logic components. In an embodiment, the control unit 26 includes one or more FPGA having a plurality of programmable logic components. In an embodiment, the control unit 26 includes hardware circuit implementations (e.g., implementations in analog circuitry, implementations in digital circuitry, and the like, and combinations thereof). In an embodiment, the control unit 26 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for analyzing a measured signal comprising the following steps:
   acquiring at least a first segment and a second segment of said measured signal by a measurement unit;
   storing said at least a first segment and a second segment in an acquisition memory of said measurement unit;
   applying a filter on said at least a first segment and a second segment; and
   in response to determining that said first segment corresponds to the filter and said second segment does not correspond to the filter:
      storing said first segment but not said second segment in at least one of a display memory and a processor memory of said measurement unit; and
      processing segments stored in said at least one of a display memory and a processor memory without processing segments stored in said acquisition memory.

2. The method according to claim 1, wherein said filter is applied by comparing said at least a first segment and a second segment with a filter condition of said filter, and one of said segments of said at least a first segment and a second segment corresponds to said filter if said segment meets said filter condition.

3. The method according to claim 1, wherein said filter is applied by comparing said at least a first segment and a second segment with a filter condition of said filter, and one of said segments of said at least a first segment and a second segment corresponds to said filter if said segment does not meet said filter condition.

4. The method according to claim 1, wherein said processing segments stored in said at least one of a display memory and a processor memory without processing segments stored in said acquisition memory includes displaying said segments stored in said at least one of a display memory and a processor memory by a display unit of said measurement unit.

5. The method according to claim 1, wherein the measurement unit is provided with at least two different filter conditions.

6. The method according to claim 1, wherein the measurement unit is provided with at least two different filters.

7. The method according to claim 1, wherein at least one of a bus error filter, a search event filter, a clipping filter, and a time controlled filter is provided.

8. The method according to claim 7, wherein said filter condition of said bus error filter is the presence of at least one bus error.

9. The method according to claim 7, wherein said filter condition of said search event filter is a threshold value of a characteristic property.

10. The method according to claim 7, wherein said filter condition of said clipping filter is the presence of at least one override of an analog-to-digital converter of said measurement unit.

11. The method according to claim 7, wherein said filter condition of said time controlled filter is a time interval of segment acquisition times.

12. The method according to claim 1, wherein said at least first segment and second segment are acquired simultaneously or at different times.

13. The method according to claim 1, wherein said filter is chosen by the user of the measurement unit.

14. The method according to claim 1, wherein said processing segments stored in said at least one of a display memory and a processor memory includes playing said segments stored in said at least one of a display memory and a processor memory using a segment player provided by the measurement unit.

15. The method according to claim 1, wherein said measurement unit is configured to allow the user of the measurement unit to scroll through said segments stored in said at least one of a display memory and a processor memory.

16. A measurement unit for analyzing a measured signal, wherein said measurement unit is configured to perform the following steps:
   acquiring at least a first segment and a second segment of said measured signal by a measurement unit;
   storing said at least a first segment and a second segment in an acquisition memory of said measurement unit;
   applying a filter on said at least a first segment and a second segment; and
   in response to determining that said first segment corresponds to the filter and said second segment does not correspond to the filter:
      storing said first segment but not said second segment in at least one of a display memory and a processor memory of said measurement unit; and
      processing segments stored in said at least one of a display memory and a processor memory without processing segments stored in said acquisition memory.

17. A method for analyzing a measured signal comprising the following steps:
   acquiring at least a first segment and a second segment of said measured signal by a measurement unit;
   storing said at least a first segment and a second segment in an acquisition memory of said measurement unit;
   applying a filter on said at least a first segment and a second segment; and
   in response to determining that said first segment corresponds to the filter and said second segment does not correspond to the filter:
      storing said first segment but not said second segment in at least one of a display memory and a processor memory of said measurement unit; and
      processing segments stored in said at least one of a display memory and a processor memory without processing segments stored in said acquisition memory, wherein said processing includes displaying said segments by a display unit of said measurement unit to allow a user to scroll through the displayed segments.

* * * * *